(12) United States Patent
Ogura et al.

(10) Patent No.: US 8,520,102 B2
(45) Date of Patent: Aug. 27, 2013

(54) SOLID-STATE IMAGING APPARATUS

(75) Inventors: Masanori Ogura, Tokyo (JP); Yuichiro Yamashita, Ebina (JP); Toru Koizumi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 294 days.

(21) Appl. No.: 13/075,259

(22) Filed: Mar. 30, 2011

(65) Prior Publication Data

US 2011/0242380 A1    Oct. 6, 2011

(30) Foreign Application Priority Data

Apr. 6, 2010    (JP) .................................. 2010-088080

(51) Int. Cl.
*H04N 9/64* (2006.01)
*H04N 3/14* (2006.01)
*H01L 27/148* (2006.01)

(52) U.S. Cl.
USPC ............................ 348/248; 348/300; 257/218

(58) Field of Classification Search
USPC ......... 348/248, 294, 300, 301, 308; 257/218, 257/274, 287–288
See application file for complete search history.

(56) References Cited

U.S. PATENT DOCUMENTS

| | | | |
|---|---|---|---|
| 5,121,225 A | 6/1992 | Murata et al. .................. | 358/471 |
| 5,475,211 A | 12/1995 | Ogura et al. ................ | 250/208.1 |
| 5,698,892 A | 12/1997 | Koizumi et al. .............. | 257/620 |
| 6,188,094 B1 | 2/2001 | Kochi et al. ................... | 257/232 |
| 6,670,990 B1 | 12/2003 | Kochi et al. .................... | 348/310 |
| 6,960,751 B2 | 11/2005 | Hiyama et al. ............. | 250/208.1 |
| 7,016,089 B2 | 3/2006 | Yoneda et al. ................ | 358/482 |
| 7,110,030 B1 | 9/2006 | Kochi et al. .................. | 348/308 |
| 7,227,208 B2 | 6/2007 | Ogura et al. .................. | 257/292 |
| 7,321,110 B2 | 1/2008 | Okita et al. ................ | 250/208.1 |
| 7,324,144 B1 | 1/2008 | Koizumi ....................... | 348/294 |
| 7,348,615 B2 | 3/2008 | Koizumi ....................... | 257/292 |
| 7,408,210 B2 | 8/2008 | Ogura et al. .................. | 257/233 |
| 7,429,764 B2 | 9/2008 | Koizumi et al. ............. | 257/292 |
| 7,456,880 B2 | 11/2008 | Okita et al. ................... | 348/243 |
| 7,460,162 B2 | 12/2008 | Koizumi et al. ............. | 348/294 |
| 7,466,003 B2 | 12/2008 | Ueno et al. ................... | 257/462 |
| 7,514,732 B2 | 4/2009 | Okita et al. ................... | 257/292 |
| 7,538,810 B2 | 5/2009 | Koizumi et al. ............. | 348/308 |
| 7,550,793 B2 | 6/2009 | Itano et al. .................... | 257/239 |
| 7,554,591 B2 | 6/2009 | Kikuchi et al. ............... | 348/308 |
| 7,605,415 B2 | 10/2009 | Koizumi et al. ............. | 257/291 |
| 7,605,853 B2 * | 10/2009 | Mutoh et al. ................. | 348/300 |
| 7,623,056 B2 | 11/2009 | Yamashita .................... | 341/163 |
| 7,629,568 B2 | 12/2009 | Koizumi et al. .......... | 250/214 R |

(Continued)

FOREIGN PATENT DOCUMENTS

JP    2005-217158 A    8/2005

*Primary Examiner* — Trung Diep
(74) *Attorney, Agent, or Firm* — Fitzpatrick, Cella, Harper & Scinto (57) ABSTRACT

A solid-state imaging apparatus is provided that including a plurality of amplifiers each one amplifying a signal from each one of a plurality of pixels. The amplifier including first and second field effect transistors, gate electrodes of which are connected to the same voltage node (VBL); and a first wiring connected between the voltage node and the gate electrodes of the first and second field effect transistors. The first and second field effect transistors are arranged in a direction perpendicular to a direction in which the plurality of amplifiers is arranged. Material of the first wiring has a resistivity smaller than that of the gate electrodes of the first and second field effect transistors.

8 Claims, 8 Drawing Sheets

(56) References Cited

U.S. PATENT DOCUMENTS

| | | | |
|---|---|---|---|
| 7,638,826 B2 | 12/2009 | Hiyama et al. | 257/291 |
| 7,679,658 B2 | 3/2010 | Sakurai et al. | 348/243 |
| 7,808,537 B2 | 10/2010 | Fujimura et al. | 348/300 |
| 7,812,873 B2 | 10/2010 | Hiyama et al. | 348/294 |
| 7,812,876 B2 | 10/2010 | Hiyama et al. | 348/300 |
| 7,817,199 B2 | 10/2010 | Yamashita et al. | 348/308 |
| 7,872,286 B2 | 1/2011 | Okita et al. | 257/291 |
| 7,907,196 B2 | 3/2011 | Ogura et al. | 348/308 |
| 7,928,477 B2 | 4/2011 | Kobayashi et al. | 257/225 |
| 7,948,540 B2 | 5/2011 | Ogura et al. | 348/300 |
| 7,948,541 B2 | 5/2011 | Koizumi et al. | 348/300 |
| 2004/0090254 A1* | 5/2004 | Owens et al. | 327/170 |
| 2005/0030107 A1* | 2/2005 | Shimizu et al. | 330/307 |
| 2005/0068439 A1* | 3/2005 | Kozlowski et al. | 348/308 |
| 2005/0168605 A1 | 8/2005 | Hiyama et al. | 348/301 |
| 2008/0036891 A1 | 2/2008 | Ono et al. | 348/308 |
| 2009/0207293 A1 | 8/2009 | Ryoki et al. | 348/308 |
| 2009/0219429 A1 | 9/2009 | Ogura et al. | 348/308 |
| 2009/0284632 A1 | 11/2009 | Onuki et al. | 348/302 |
| 2010/0002114 A1 | 1/2010 | Ogura et al. | 348/301 |
| 2010/0053398 A1 | 3/2010 | Yamashita | 348/302 |
| 2010/0060754 A1 | 3/2010 | Ogura et al. | 348/241 |
| 2010/0060762 A1 | 3/2010 | Takada et al. | 348/300 |
| 2010/0066881 A1 | 3/2010 | Ryoki et al. | 348/302 |
| 2010/0165167 A1 | 7/2010 | Sugiyama et al. | 348/311 |
| 2010/0194947 A1 | 8/2010 | Ogura et al. | 348/301 |
| 2010/0200738 A1 | 8/2010 | Yamashita | 250/227.11 |
| 2010/0225793 A1 | 9/2010 | Matsuda et al. | 348/280 |
| 2010/0264298 A1 | 10/2010 | Ryoki et al. | 250/208.1 |
| 2010/0328302 A1 | 12/2010 | Yamashita et al. | 345/214 |
| 2011/0013062 A1 | 1/2011 | Yamashita | 348/294 |
| 2011/0032379 A1 | 2/2011 | Kobayashi et al. | 348/222.1 |
| 2011/0080492 A1 | 4/2011 | Matsuda et al. | 348/222.1 |
| 2011/0080493 A1 | 4/2011 | Kono et al. | 348/222.1 |
| 2011/0134270 A1 | 6/2011 | Arishima et al. | 348/222.1 |

* cited by examiner

CONFIGURATION OF
INCIDENT LIGHT

FIG. 8B

OUTPUT IMAGE OF
IMAGING APPARATUS

SOLID-STATE IMAGING APPARATUS

BACKGROUND OF THE INVENTION

1. Field of the Invention

The present invention relates to a solid-state imaging apparatus.

2. Description of the Related Art

An active solid-state imaging apparatus, such as a CMOS image sensor is provided with pixels including photoelectric conversion devices, and signal processing circuits processing electric signals of the pixels. Japanese Patent Application Laid-Open No. 2005-217158 discloses a solid-state imaging apparatus including a signal processing circuit. This document discloses the signal processing circuit that receives pixel signals from pixel columns via a signal output line and amplifies or processes the signals. A method is effective that applies high gain to the signal processing circuit in order to compensate reduction in sensitivity owing to reduction of pixel areas. Thus, an amplifier including a cascode circuit is used.

SUMMARY OF THE INVENTION

As pixel sizes have been reduced according to a recent multipixel tendency, it is required to also reduce layout dimensions of signal processing circuits. A signal processing circuit disposed in a column direction of pixels arranged in a two-dimensional matrix form is narrowly disposed in the vertical direction of the matrix. As the pixel sizes are reduced, it is required to lay out the circuit in a narrower width. In Japanese Patent Application Laid-Open No. 2005-217158, in order to reduce the layout width of the signal processing circuit, it is required to reduce dimensions of transistors or change directions of channels of the transistors. The dimensions of transistors are restricted by power source voltage of the circuit, resolution of a stepper used in a manufacturing process, and alignment accuracy. In particular, the power source voltage cannot easily be reduced in view of performance of the solid-state imaging apparatus. This is because the signal processing circuit of the solid-state imaging apparatus includes analog circuit and reduction in power source voltage directly causes reduction in dynamic range. The narrower the width of a wiring, the greater the resistance of the wiring becomes. Accordingly, it becomes difficult to suppress variation in signal when voltage changes. Thus, there is a case of causing a problem in that signals of a certain signal processing circuit cause a "false signal" in another signal processing circuit.

It is an object of the present invention to provide a solid-state imaging apparatus capable of suppressing a false signal.

A solid-state imaging apparatus according to the present invention comprises: a plurality of amplifiers each one amplifying a signal from each one of a plurality of pixels, wherein the amplifier includes first and second field effect transistors of which gate electrodes are connected to a same voltage node, and a first wiring connected to the voltage node and the gate electrodes of the first and second field effect transistors, wherein the first and second field effect transistors are arranged along a direction different from a direction along which the plurality of amplifiers are arranged, and wherein the first wiring is formed from a material having a resistivity lower than a resistivity of the gate electrodes of the first and second field transistors.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

Figure 1:
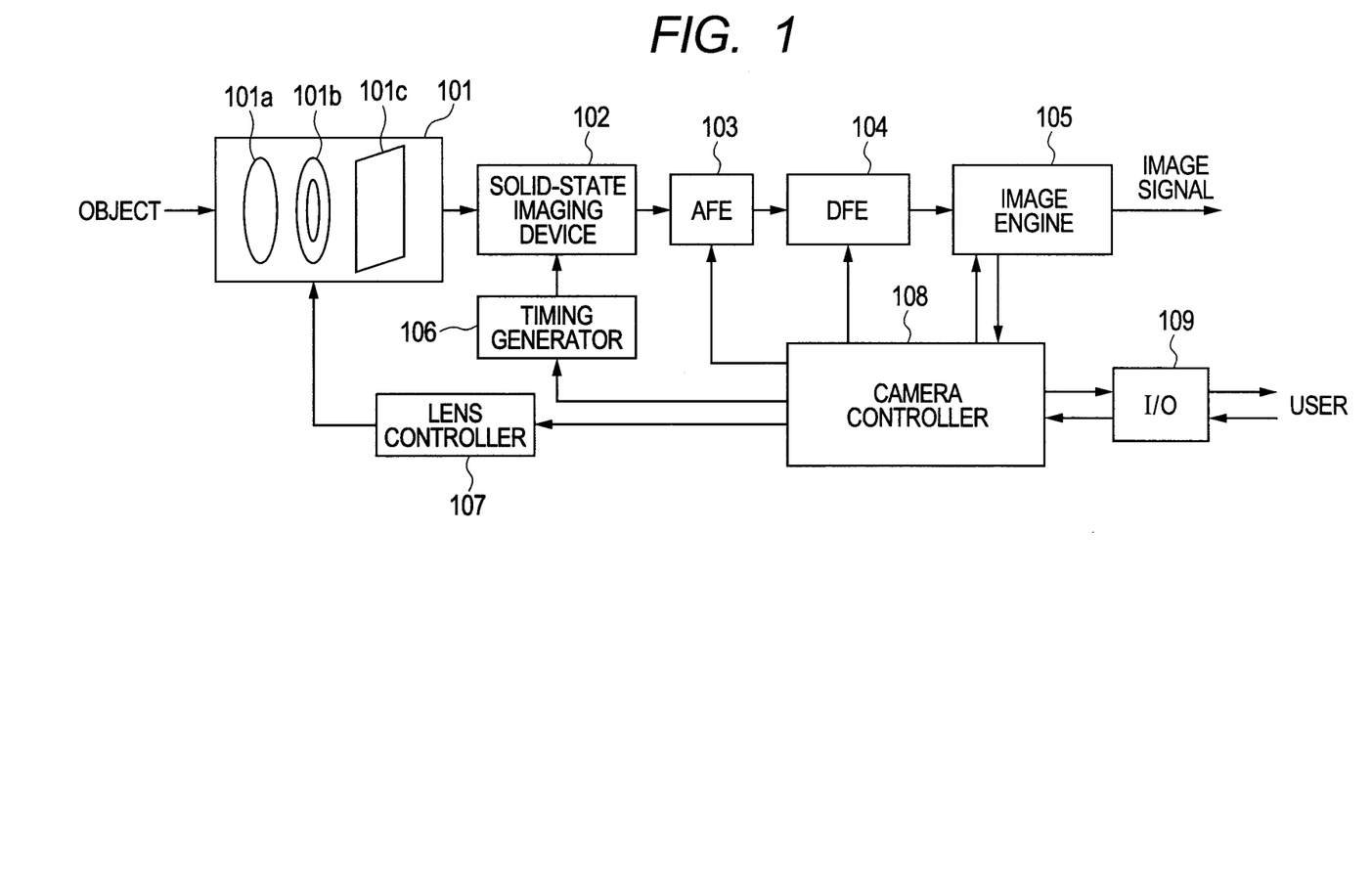
FIG. 1 is a diagram illustrating an example of a configuration of a solid-state imaging apparatus according to a first embodiment of the present invention.

FIG. 1 is a block diagram illustrating an example of a configuration of a solid-state imaging apparatus according to a first embodiment of the present invention. The solid-state imaging apparatus may be, for example, one of a digital single lens reflex camera, a compact digital camera, a video camera, a cellular phone digital camera and a broadcasting digital camera. The solid-state imaging apparatus includes an optical system 101, a solid-state imaging device 102, an AFE 103, a DFE 104, an image engine 105, a timing generator 106, a lens controller 107, a camera controller 108 and an interface 109. The AFE 103 is an analog frontend. The DFE is a digital frontend. The optical system 101 includes a lens 101a forming an image of incident light from an object on an imaging surface of an solid-state imaging device 102, a diaphragm 101b controlling the amount of incident light passing through the lens 101a and a shutter 101c, and the shutter 101c controlling the time of light incident on the solid-state imaging device 102. The lens controller 107 controls the optical system 101. The solid-state imaging device 102 photoelectrically converts light incident through the optical system 101 in units of pixels, and outputs an image signal as an electric signal. The timing generator 106 controls the solid-state imaging device 102. The AFE 103 applies an analog signal processing on the image signal output from the solid-state imaging device 102. The DFE 104 applies a digital signal processing on an output signal from the AFE 103. The image engine 105 performs image processing by communication with the camera controller 108, and outputs an image signal. The interface 109 inputs and outputs a signal to and from the outside by communication with the camera controller 108. The camera controller 108 controls the lens controller 107, the timing generator 106, the AFE 103 and the DFE 104.

Figure 2:
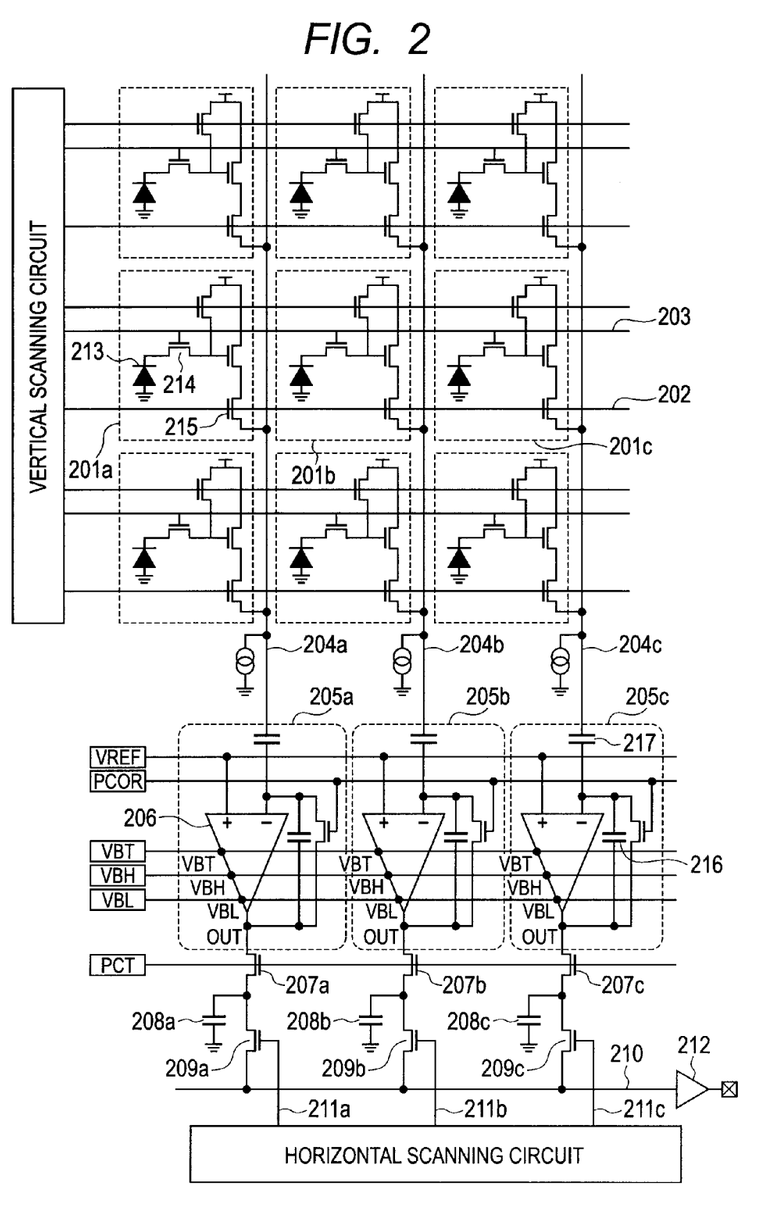
FIG. 2 is a diagram of an equivalent circuit of a solid-state imaging device of the first embodiment.

FIG. 2 is a circuit diagram illustrating an example of a configuration of the solid-state imaging device 102 of FIG. 1. The solid-state imaging device 102 is, for example, a CMOS imaging sensor. Each of pixels 201a, 201b and 201c includes a photodiode 213 and a plurality of transistors 214 and 215. The photodiode 213 is a photoelectric conversion device generating a pixel signal by photoelectric conversion. The transistors 214 are transfer transistors for reading the pixel signals generated by the photodiodes 213. The transistors 215 are line selection transistors for outputting the pixel signal read by the transfer transistors 214 to respective signal output lines 204a, 204b and 204c. The wiring 202 and 203 are connected to a vertical scanning circuit, provides a pulse signal for the sake of reading signals from the pixels 201a, 201b and 201c, and are commonly connected to pixels 201a, 201b and 201c in a horizontal direction. The pixel signals generated by the pixels 201a, 201b and 201c are output through signal output lines 204a, 204b and 204c, respectively. Signal processing circuits 205a, 205b and 205c, each of which includes an amplifier 206, a plurality of capacitors 216 and 217 and a transistor, are provided for the signal output lines 204a, 204b and 204c, and amplify pixel signals from the signal output lines 204a, 204b and 204c, respectively. The output signals from the signal processing circuits 205a, 205b and 206c are held in capacitors 208a, 208b and 208c via transistors 207a, 207b and 207c, respectively. Transistors 209a, 209b and 209c are sequentially turned on by signals from control lines 211a, 211b and 211c sequentially supplied from the horizontal scanning circuit, respectively. The signals held in the capacitors 208a to 208c are read by the horizontal signal output line 210. The amplifier 212 amplifies and outputs the signal in the horizontal signal output line 210.

Figure 3:
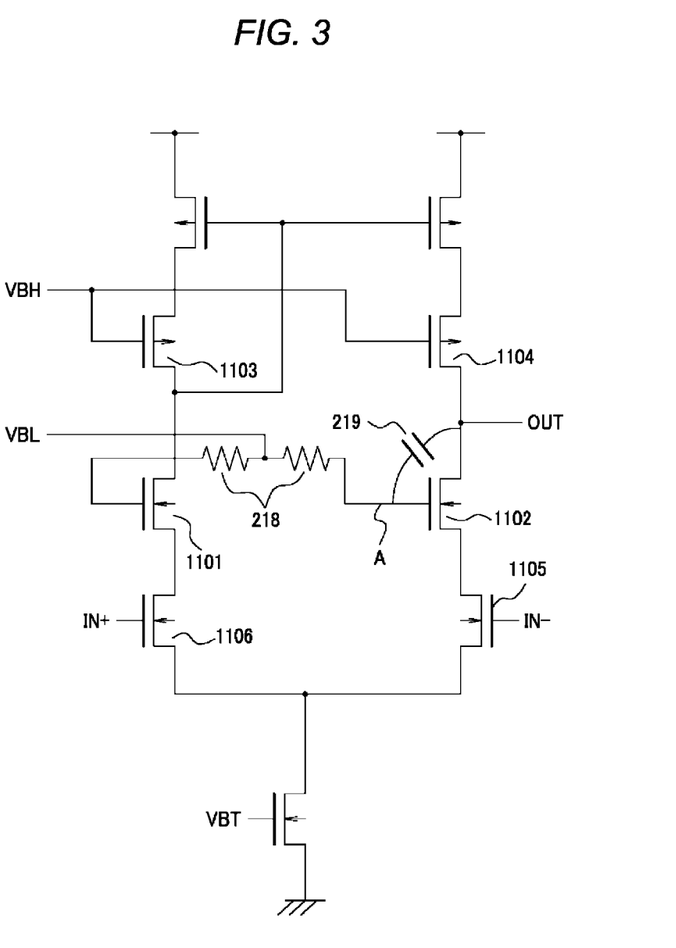
FIG. 3 is a diagram of an equivalent circuit of an amplifier of the first embodiment.

FIG. 3 is a circuit diagram illustrating an example of a configuration of the amplifier 206 in FIG. 2. As illustrated in FIG. 3, a voltage VBL in FIG. 2 is provided with a wiring in a prescribed direction, and commonly input into a cascode circuit of the amplifier 206 of each of signal processing circuits 205a to 205c. FIG. 2 illustrates a pixel arrangement with three lines and three columns, for the sake of simplicity. However, in actuality, a lot of signal processing circuits are arranged. Likewise, voltages VREF, VBT, VBH and VBL and a driving signal PC0R are input into each of signal processing circuits 205a to 205c.

In FIG. 3, a first and second field effect transistors 1101 and 1102 are cascode circuits where nodes of the same voltage VBL are connected to gate electrodes. In a case where the distance between gates the transistors 1101 and 1102 configuring the cascode circuit becomes greater, a parasitic resistance occurs at a gate wiring 218. A capacity 219 is a parasitic capacity causing at the gate and drain of the transistor 1102. The capacity 219 between the gate and drain (or the source) also occurs by a parasitic capacity between the gate or a wiring connected to the gate and a wiring connected to the drain, which is generated for not only FIG. 3 but also any MOS transistor. A transistor 1103 is connected to the transistor 1101 in series. A transistor 1104 is connected to the transistor 1102 in series. A point A is a gate of the transistor 1102 and supplied with the voltage VBL via the parasitic resistance 218. A transistor 1106 is connected to the transistors 1101 and 1103 in series; a positive input signal IN+ is input into the gate thereof. The transistor 1105 is connected to the transistors 1102 and 1104 in series; a negative input signal IN− is input into the gate thereof.

Figure 4:
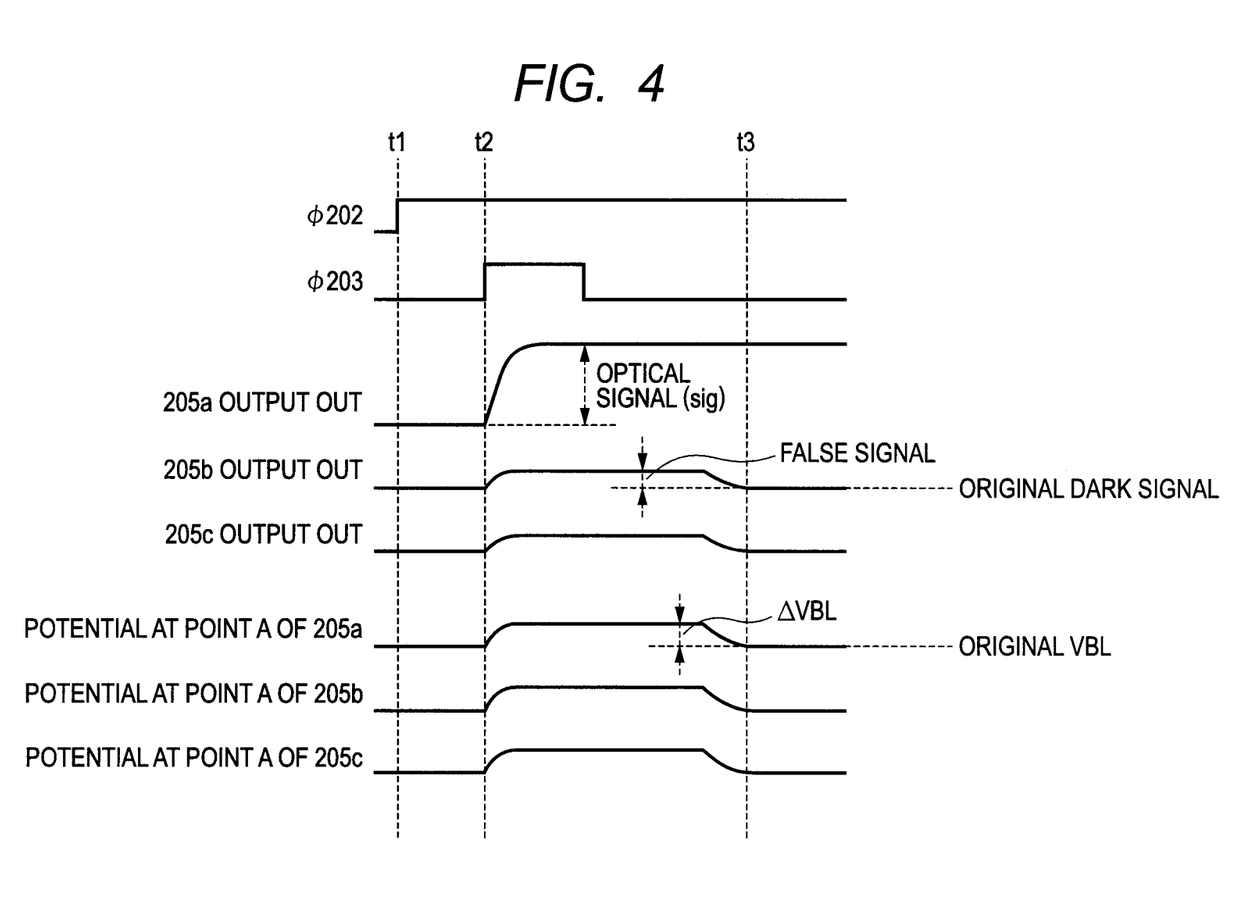
FIG. 4 is a schematic diagram of reading of the solid-state imaging apparatus of the first embodiment.

FIG. 4 is a diagram illustrating output waveforms from the signal processing circuits 205a, 205b and 205c in FIG. 2. This diagram illustrates variation in outputs from the signal processing circuit 205a, 205b and 205c and the voltage VBL at the point A in FIG. 3 in a case where the pixel 201a is irradiated with light to be a bright region and the pixels 201b and 201c are set to be dark regions or light-shielded. On a time t1, a high level selection pulse signal φ202 is supplied from the vertical scanning circuit to the gate of the line selection transistor 215 of each of the pixels 201a to 201c via the wiring 202, and the line selection transistor 215 is turned on. Next, on time t2, a high level transfer pulse signal φ203 is supplied from the vertical scanning circuit to the gate of the transfer transistor 214 of each of the pixels 201a, 201b and 201c via the wiring 203, and the transfer transistor 214 is turned on. The pixel signals of the photodiodes 213 of the pixels 201a, 201b and 201c are input into the signal processing circuits 205a, 205b and 205c via the signal output lines 204a, 204b and 204c, respectively. An output OUT of the signal processing circuit 205a corresponding to the pixel 201a in the bright region is increased in proportion to the magnitude of the signal. Thus, variation in potential of $\Delta$VBL at the point A of each of the signal processing circuits 205a to 205c to which the voltage VBL is supplied via the parasitic capacity 219. This variation is a result of a capacity coupling between the output OUT of the signal processing circuit 205a corresponding to the pixel 201a in the bright region and the point A because of the parasitic capacity 219. More specifically, according to an optical signal (sig) of the output OUT from the signal processing circuit 205a, the potential at the point A of the amplifier 206 of the signal processing circuit 205a is varied in $\Delta$VBL. Since the signal processing circuits 205a to 205c are supplied with the voltage VBL in the horizontal direction via the common wiring, variation in $\Delta$VBL at the point A of the signal processing circuit 205a in the bright region also influences to the signal processing circuits 205b and 205c, which are in the dark regions. As a result, the potential at the point A of each of the signal processing circuits 205b and 205c is varied in $\Delta$VBL. According to this variation, the output OUT from each of the signal processing circuits 205b and 205c of the dark regions is further varied. The variation of the output OUT in each of the signal processing circuits 205b and 205c is the "false signal", which is not an original image signal.

A supply circuit supplying the voltage VBL pulls into current in order to suppress the variation in potential and tries to restore the voltage to the original voltage VBL. However, a long time is required owing to the parasitic resistance 218 (time period t2 to t3). In a case where signal reading from the signal processing circuits 205a to 205c is completed in a limited time, increase in potential at the point A remains. In the signal processing circuits 205b and 205c in the dark region, when the point A is increased in voltage, the potential of the output terminal OUT is increased due to the capacity 219 between the gate and the drain of the transistor 1102, and a false signal brighter than the original dark signal is output. If the signal reading time (time period t2 to t3) is increased, this problem is alleviated. However, the frame speed and frame rate are decreased. Although detailed description is omitted, the same problem occurs in the voltage VBH if parasitic resistances occur at the gates of the transistors 1103 and 1104.

Figure 8A:
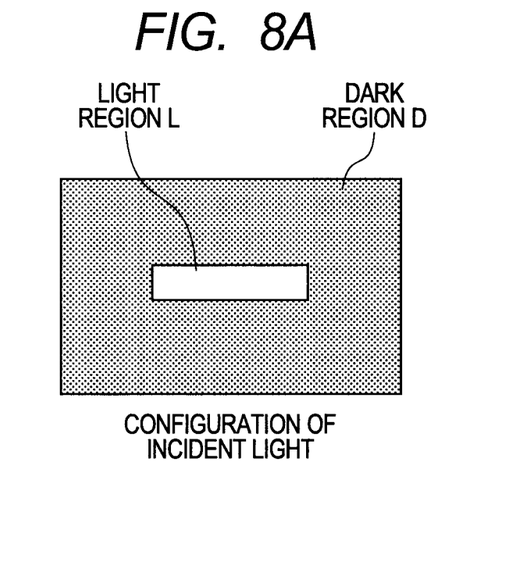
FIGS. 8A and 8B are schematic diagrams of input and output of the solid-state imaging apparatus of the first embodiment.
Figure 8B:
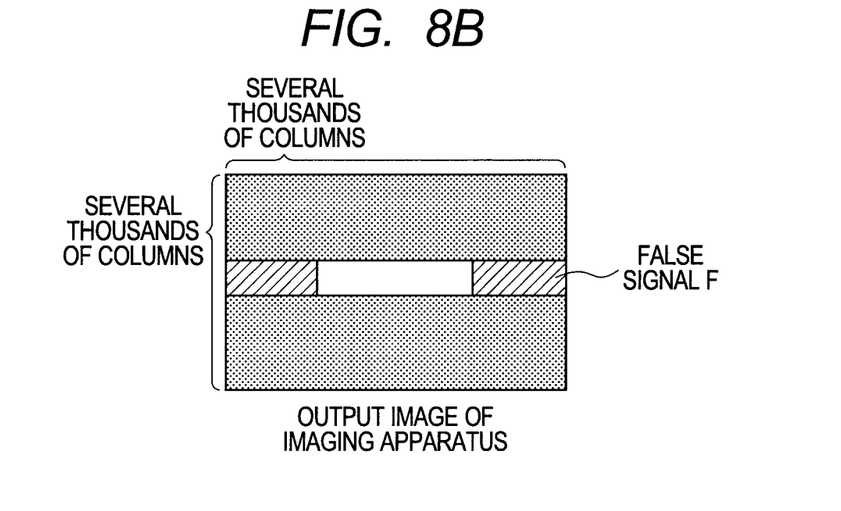

FIG. 2 exemplifies a case where the pixel arrangement includes 3×3. In actuality, as illustrated in FIGS. 8A and 8B, the pixel arrangement includes several thousands of columns×several thousands of lines. FIG. 8A illustrates situations of a pixel region of incident light. The pixel region includes a bright region L and a dark region D. FIG. 8B illustrates an output image of the solid-state imaging apparatus, where an image of a false signal F is generated. The false signal F occurs at a dark region D at right and left parts at the same line as that of the bright region L. If outputs from the signal processing circuits 205a to 205c of the several thousands of columns increase, capacity coupling is applied due to the parasitic capacities 219 of the several thousands of columns. Accordingly, the $\Delta$VBL is significantly increased and the false signal is also increased. The above description has exemplified the false signal in a case where the potential at the point A is increased. In a case where the potential at the point A is reduced, a false signal providing an output darker than actual incident light is output. In this embodiment, variational potential ΔVBL is suppressed by reducing the parasitic resistance 218 between the gates of transistors 1101 and 1102 configuring the cascode circuit and the wiring supplying the voltage VBL.

Figure 5:
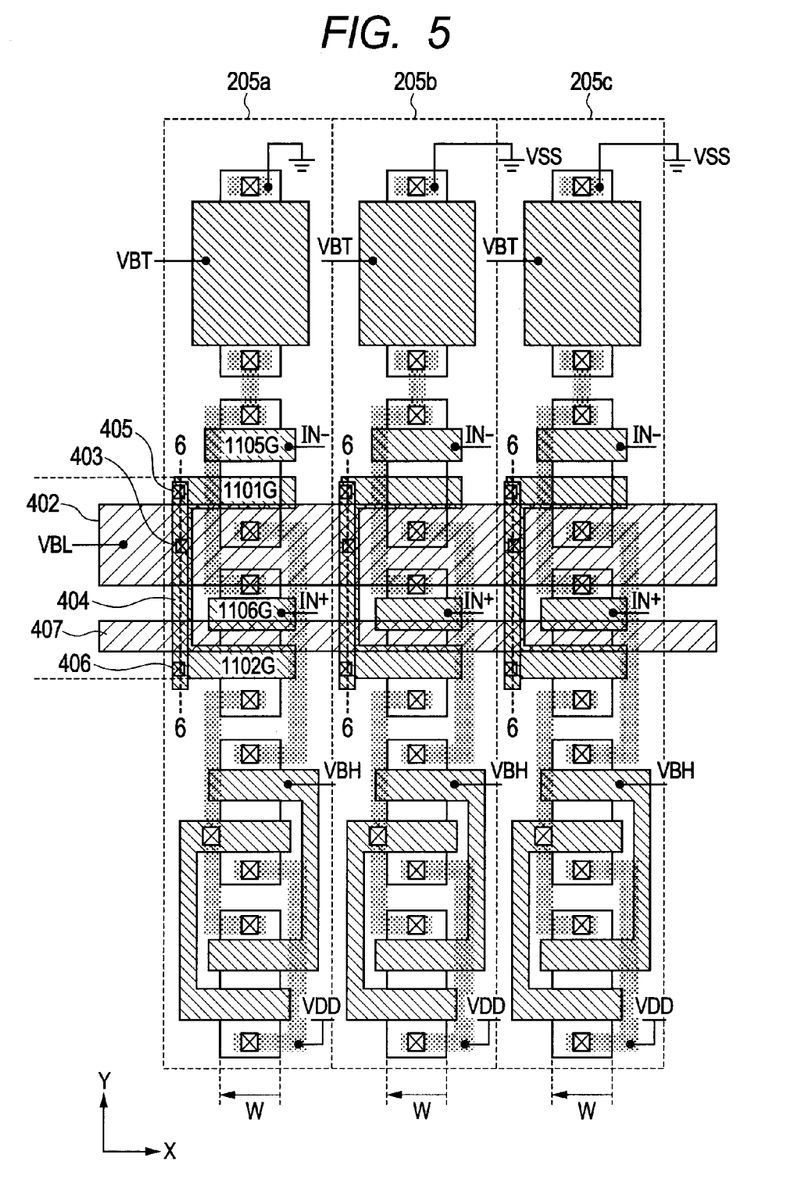
FIG. 5 is a pattern layout diagram of the amplifier of the first embodiment.

FIG. 5 is a pattern layout diagram of the amplifiers 206 of the signal processing circuits 205a to 205c of the solid-state imaging device 102 of this embodiment. The signal processing circuits 205a to 205c are formed correspondingly to the signal output lines 204a to 204c where the pixel signals are read from the pixels 201a to 201c, respectively, and amplify and process the pixel signals. Each of the signal processing circuits 205a to 205c is provided with the amplifier 206 including the cascode circuit. Gate electrodes 1101G and 1102G are of the transistors 1101 and 1102 including the cascode circuits, and electrically connected by a material whose main ingredient is polysilicon identical to that of the gate electrodes. An electrode 1105G is a negative input gate electrode of a negative input signal IN− of the transistor 1105. An electrode 1106G is a positive input gate electrode of a positive input signal IN+ of the transistor 1106. A wiring 402 is made of conductive material introducing voltage VBL to be supplied to the cascode circuit. The wiring 402 is arranged in a direction X, along which the signal processing circuits 205a to 205c are arranged, and supplied to the cascode circuit of the amplifier 206 of each of the signal processing circuits 205a to 205c. A plug 403 connects different wiring layers, and connects the wirings 402 and 404 to each other. A wiring 404 is made of conductive material for connecting the gate electrodes 1101G and 1102G of the transistors 1101 and 1102 configuring the cascode circuit, orthogonal to the wiring 402 and on a layer different therefrom. Plugs 405 and 406 connect different wiring layers, and connect the wiring 404 and the gate electrodes 1101G and 1102G to each other.

Figure 6A:
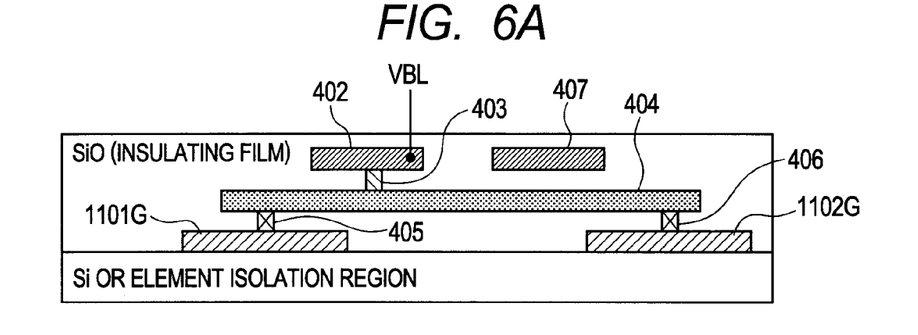
FIGS. 6A, 6B and 6C are sectional views of the amplifier of the first embodiment.
Figure 6B:
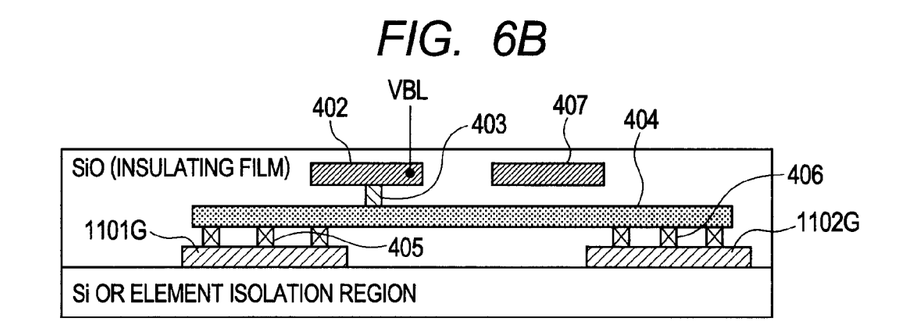
Figure 6C:
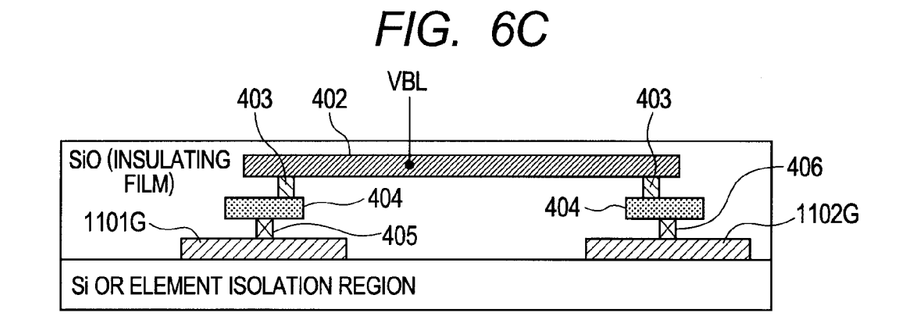

FIGS. 6A to 6C are sectional views taken along line 6 to 6 in FIG. 5. In FIG. 6A, a wiring 407 is made of conductive material and supplies various voltages. The wiring 407 is arranged in a direction along which the signal processing circuits 205a to 205c are arranged, and used as a power source voltage wiring for commonly supplying the voltages to the signal processing circuits 205a to 205c. The wirings 402, 403, 404, 405 and 406 adopt a material less resistive than that of the gate electrodes 1101G and 1102G. Accordingly, the voltage VBL can be supplied to the gate electrodes 1101G and 1102G from the wiring 402 with a low resistance. As a result, even if variation of the output terminal OUT varies the voltage VBL, charges can be charged and discharged in a short time period, enabling the original voltage VBL to be supplied to the cascode circuit. This configuration can reduce the false signal owing to an influence of an output signal of a certain signal processing circuit 205a on the output signals of the other signal processing circuits 205b and 205c and acquire signals in which the incident light has been represented in high fidelity. As illustrated in FIG. 6B, the plurality of plugs 405 and 406 may be employed. Further, as illustrated in FIG. 6C, the gate electrodes 1101G and 1102G may be connected to each other by the wiring 402.

In many cases, the positive input transistor 1106 is disposed between the transistors 1101 and 1102 configuring the cascode circuit. In these cases, the wiring layer 407 of the reference voltage VREF in FIG. 2 is arranged in a horizontal direction. In the cases, as illustrated in FIGS. 6A and 6B, a method is effective of connecting the gate electrodes 1101G and 1102G where the wiring layer 403 different from the wiring layer 402 is orthogonal.

In this embodiment, the description has been made exemplifying the case where the material of the gate electrodes 1101G and 1102G of the transistors is polysilicon. There is a method of reducing source-drain resistance adopting metallic silicide, such as Co, W, Ti and Ni. Such adoption of silicide allows the resistance to be reduced to a fraction of the resistance of the polysilicon.

On the other hand, as with this embodiment, one of aluminum and copper is adopted as wiring material of the wirings 402, 403, 404, 405 and 406, thereby allowing the resistance to be reduced to about one thousands of that of the polysilicon of the gate electrodes 1101G and 1102G. Even any one of the polysilicon and polycide can attain an effect better than an effect of reduction in resistance of material, by adopting the arrangement and connection topology of this embodiment.

The amplifier 206 includes the first and second field effect transistors 1101 and 1102 and the first wirings 402 to 406. The gate electrode 1101G of the first field effect transistor 1101 and the gate electrode 1102G of the second field effect transistor 1102 are connected to the same voltage node (VBL). The first wirings 402 to 406 are connected between the voltage node (VBL) and the gate electrodes 1101G and 1102G of the first and second field effect transistors 1101 and 1102. The first and second field effect transistors 1101 and 1102 are arranged in a direction Y perpendicular to the direction X in which the plurality of amplifiers 206 is arranged. The material of the first wirings 402 to 406 has a resistivity smaller than that of the gate electrodes 1101G and 1102G of the first and second field effect transistors 1101 and 1102.

The first wirings 402 to 406 include the second wiring 402, the first plug 403, the third wiring 404, the second plug 405 and the third plug 406. The second wiring 402 is connected to the voltage node (VBL). The first plug 403 is connected to the second wiring 402. The third wiring 404 is connected to the first plug 403. The second plug 405 is connected between the third wiring 404 and the gate electrode 1101G of the first field effect transistor 1101. The third plug 406 is connected between the third wiring 404 and the gate electrode 1102G of the second field effect transistor 1102. On the third wiring 404, the first plug 403 is arranged between the second plug 405 and the third plug 406. One of the drain and the source of the second field effect transistor 1102 is connected to the output terminal OUT of the amplifier 206. The gate electrode 1102G of the second field effect transistor 1102 is capacitively coupled to the output terminal OUT of the amplifier 206 by the parasitic capacity 219.

In order to compensate reduction in sensitivity owing to reduction in pixel area, a method of applying high gain to the signal processing circuits 205a to 205c can be employed. Instead, the signal processing circuits 205a to 205c having a gain switching function can be employed by means of making the capacitance ratio of the capacitors 216 and 217 in FIG. 2 variable. In general, high gain circuits are not responsive and time for signal processing and reading is long. In such situations, variation in potential of the ΔVBL caused by the great resistance between the gate electrodes 1101G and 1102G prevents fast processing because the time (time period t1 to t3) for absorbing the variation in potential is increased. Accordingly, the advantageous effects of this embodiment become significant by reduction in pixel size by adopting an increased number of pixels and reduction is size of peripheral circuits.

Second Embodiment

Figure 7:
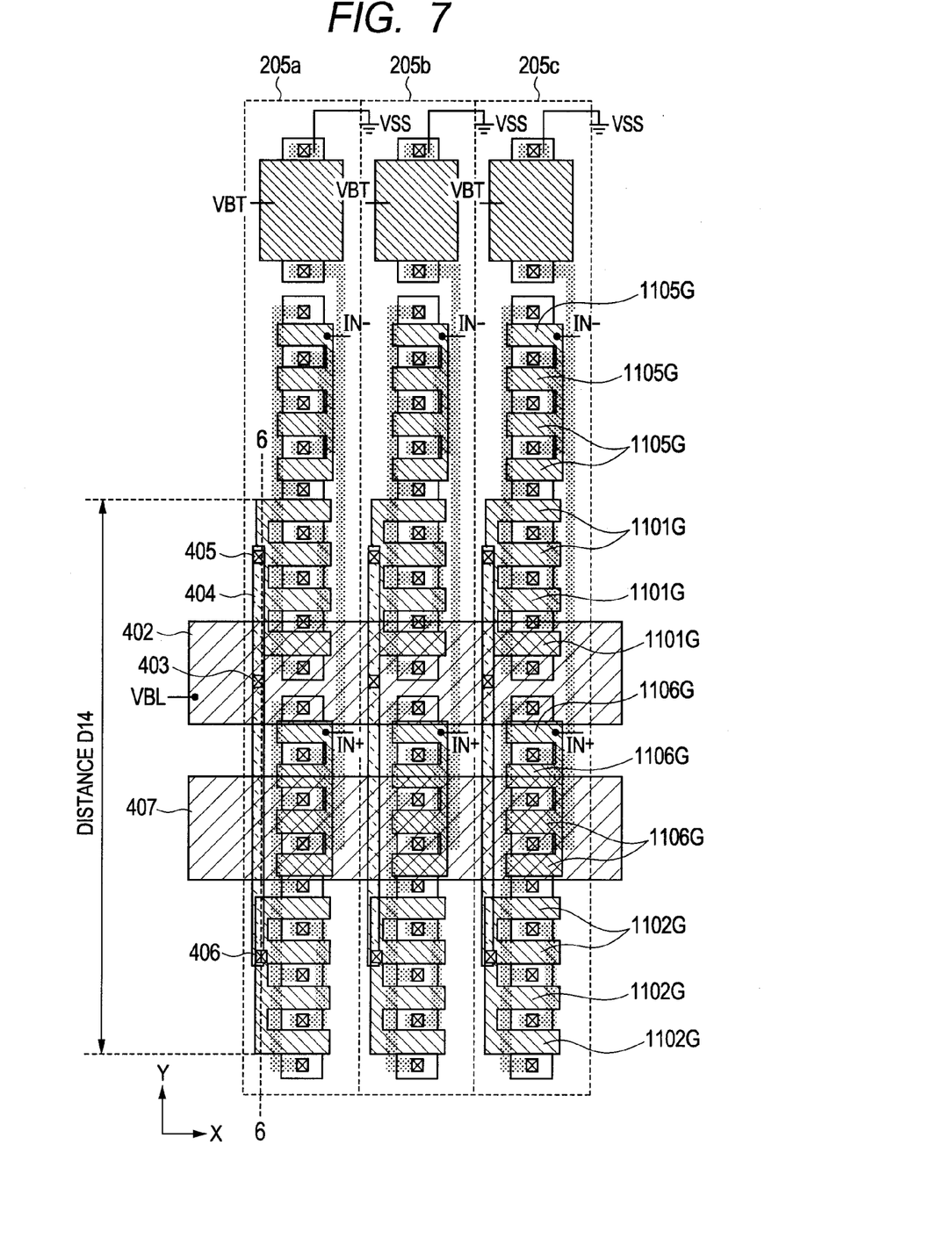
FIG. 7 is a pattern layout diagram of an amplifier of a second embodiment.

FIG. 7 is a pattern layout diagram of amplifiers 206 of signal processing circuits 205a to 205c according to a second embodiment of the present invention. Transistors 1101, 1102, 1105 and 1106 include gate electrodes 1101G, 1102G, 1105G and 1106G having a comb shape. Thus, the transistors 1101, 1102, 1105 and 1106 are configured by a parallel connection circuit of transistors. Accordingly, the channel width is widened and a high gm is attained, thereby achieving high open loop gain. In this case, the distance D14 between the gate electrode 1101G of the transistor 1101 and the gate electrode 1102G of the transistor 1102 configuring the cascode circuit is further increased, thereby allowing the advantageous effects of this embodiment to be more significant. As with the first embodiment, even with the silicide gate material, the advantageous effect of this embodiment can be attained.

The first and second embodiments reduce the resistances of the wirings 402 to 406 connected to the gate electrodes 1101G and 1102G of the transistors 1101 and 1102 configuring the cascode circuit of the signal processing circuits 205a to 205c. This reduction can suppress the false signals of the amplifiers 206 of the other signal processing circuits 205b and 205c that are caused by an output signal of the amplifier 206 of the signal processing circuit 205a, which is a part of the circuits.

The above embodiments only exemplify specific cases for implementing the present invention. The technical scope of the present invention cannot be construed in a limited manner. That is, the present invention may be implemented in various forms without departing from the technical idea and essential features thereof.

For example, the configuration has been exemplified where one amplifier is provided for each pixel column. Instead, the amplifier may be provided for a plurality of pixel columns. At least with the plurality of amplifiers processing signals from a plurality of pixels in parallel, the present invention can appropriately be applied thereto.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-088080, filed Apr. 6, 2010, which is hereby incorporated by reference herein in its entirety.

What is claimed is:

1. A solid-state imaging apparatus comprising:
a plurality of amplifiers each one amplifying a signal from each one of a plurality of pixels, wherein
the amplifier includes first and second field effect transistors of which gate electrodes are connected to a same voltage node, and a first wiring connected to the voltage node and the gate electrodes of the first and second field effect transistors, wherein
the first and second field effect transistors are arranged along a direction different from a direction along which the plurality of amplifiers are arranged, and wherein
the first wiring is formed from a material having a resistivity lower than a resistivity of the gate electrodes of the first and second field transistors.

2. The solid-state imaging apparatus according to claim 1, wherein the first wiring includes:
a second wiring connected to the voltage node,
a first plug connected to the second wiring,
a third wiring connected to the first plug,
a second plug connected between the third wiring and the gate electrode of the first field effect transistor, and
a third plug connected between the third wiring and the gate electrode of the second field effect transistor.

3. The solid-state imaging apparatus according to claim 2, wherein the first plug is arranged on the third wiring between the second and third plugs.

4. The solid-state imaging apparatus according to claim 1, wherein
a source electrode or a drain electrode of the second field effect transistor is connected to an output terminal of the amplifier.

5. The solid-state imaging apparatus according to claim 4, wherein the gate electrode of the second field effect transistor is capacitively coupled to the output terminal of the amplifier.

6. The solid-state imaging apparatus according to claim 1, wherein
the amplifier is a differential amplifier having a differential input pair including a third field effect transistor and a fourth field effect transistor,
the third field effect transistor is serially connected to the first field effect transistor, while the fourth field effect transistor is serially connected to the second field effect transistor, and
the second field effect transistor has a main electrode connected to the fourth field effect transistor and has another main electrode connected to an output of the differential amplifier.

7. The solid-state imaging apparatus according to claim 1, wherein the first and second field effect transistors have channels aligned in a same direction.

8. The solid-state imaging apparatus according to claim 7, wherein the same direction is a direction along which a column of the plurality of pixels is aligned.

* * * * *